United States Patent [19]
Armacost et al.

[11] Patent Number: 5,618,379
[45] Date of Patent: Apr. 8, 1997

[54] SELECTIVE DEPOSITION PROCESS

[75] Inventors: Michael D. Armacost, Winooski; Steven A. Grundon, Jericho; David L. Harmon, Essex; Son V. Nguyen, Williston; John F. Rembetski, Burlington, all of Vt.

[73] Assignee: International Business Machines Corporation, Armonk, N.Y.

[21] Appl. No.: 678,475

[22] Filed: Apr. 1, 1991

[51] Int. Cl.$^6$ ............................................. H01L 21/208
[52] U.S. Cl. ..................... 438/595; 216/37; 438/596; 438/792; 438/780
[58] Field of Search ....................... 156/625.1, 643.1, 156/659.1

[56]  References Cited

U.S. PATENT DOCUMENTS

| | | | |
|---|---|---|---|
| 3,342,754 | 9/1967 | Gorham | 260/2 |
| 3,895,135 | 7/1975 | Hofer | 427/248 |
| 3,900,600 | 8/1975 | Spaulding | 427/99 |
| 4,299,866 | 11/1981 | Clark et al. | 427/255.6 |
| 4,576,834 | 3/1986 | Sobczak | 427/93 |
| 4,743,327 | 5/1988 | DeHaan et al. | 156/272.6 |
| 4,784,881 | 11/1988 | Fiore et al. | 427/255.6 |

OTHER PUBLICATIONS

"Some Mechanical and Electrical Properties of Polyfluoro–p–Xylylene Films Prepared by Chemical Vapor Deposition", J. of Applied Polymer Science, vol. 40, 1795–1800 (1990).

"Proceedings Of The Seventh Symposium On Plasma Processing", The Electrochem. Soc., Proceedings, vol. 88–22 (1988), pp. 59–66.

Primary Examiner—R. Bruce Breneman
Assistant Examiner—Mara Ronda
Attorney, Agent, or Firm—William D. Sabo

[57]  ABSTRACT

Disclosed is a process for depositing a conformal polymer coating on selected areas of a silicon substrate. The substrate is first exposed through a mask to a gaseous plasma so as to form a film of desired pattern, the plasma comprising a compound having strong electron donating characteristics. Then, the patterned film and the remaining substrate not covered by the film are exposed to the vapor of a monomer, which condenses and polymerizes on the exposed substrate surfaces, but not on the film. The film serves to inhibit substantial deposition of the coating, so as to provide a selective deposition, where the coating is formed only on those areas of the substrate where desired.

17 Claims, 3 Drawing Sheets

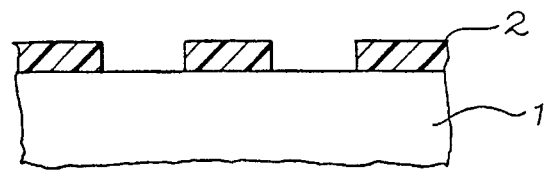
Fig. 1a.
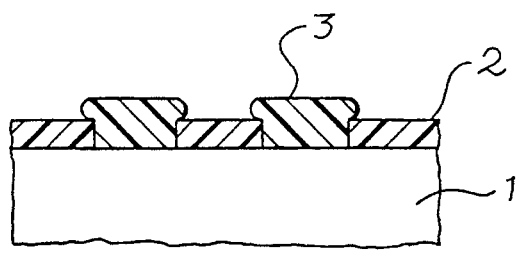
Fig. 1b.
Fig. 2.
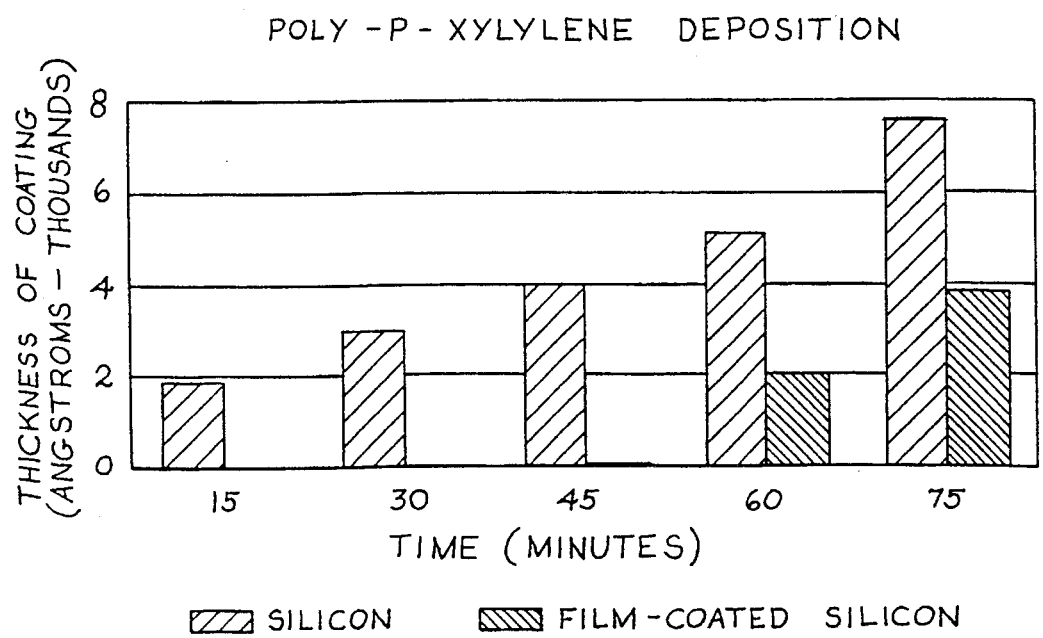

SELECTIVE DEPOSITION PROCESS

BACKGROUND OF THE INVENTION

1. Field of the Invention

This invention relates to a process for selectively depositing a conformal polymer coating on a substrate, such as a surface of a semiconductor device.

2. Description of the Prior Art

Various processes are known for depositing a conformal polymer coating, so as to mask selected areas of a substrate. Commonly used, for this purpose, are the poly-p-xylylene polymers, formed by condensation of p-xylylene monomer or its derivatives.

See U.S. Pat. No. 3,895,135, issued to Hofer on Jul. 15, 1975, in which a portion of a substrate, which is not to be coated with the polymer, is masked, with masking tape or the like, to form a constricted flow path for the vapor of the precursor. The coating forms over the mask, as well as the unmasked portions of the substrate; and the purpose of the constriction is to provide a thin coating at the masked/unmasked interface. The thin coating then serves as a tearline for removing the coated mask along the interface, leaving the coating only on the desired portions of the substrate.

See also U.S. Pat. No. 4,299,866, issued to Clark, et al. on Nov. 10, 1981, in which areas of a workpiece (such as the leads connected to a semiconductor chip), which are not to be coated with the polymer, are coated with a non-polymerizing hydrocarbon, e.g. Beeswax. The polymer coating forms over the workpiece, upon exposure to the vapor of the precursor, and openings are then formed in the coating. The workpiece is then immersed in a solvent, to swell the hydrocarbon, thereby causing removal of the coating overlying the hydrocarbon.

Both of these processes require, however, cumbersome sequences of mechanical steps, which deposit the coating everywhere and then remove it from the undesired portions of the substrate. This approach is particularly burdensome, in that poly-p-xylylene coatings adhere very tenaciously, making it difficult to remove them from the precise locations as desired.

SUMMARY OF THE INVENTION

Now, in accordance with the invention, an improved process has been discovered for forming a conformal coating on selected areas of a substrate. The process involves first forming a patterned film on the substrate, exposing selected areas, the film being formed by treating the substrate with a compound having strong electron donor characteristics, such as a metal. Preferably, the film is formed by exposing the substrate to a gaseous plasma, preferably comprising a halogen-containing compound. Then, the patterned film and the substrate are exposed to the vapor of a monomer under such conditions as to condense the monomer to form a conformal coating on those areas of the substrate which are not covered by the patterned film, which inhibits substantial deposition of the coating. Thus, in the practice of the invention, a conformal polymer coating is selectively deposited only on those portions of the substrate where desired. As such, complicated mechanical schemes for removing the strongly adhering coating are not required, as the coating is selectively formed.

In a preferred embodiment, a conformal polymer coating is formed on selected surfaces of a substrate trench. During trench formation, the substrate is exposed to a gaseous plasma comprising a halogen-containing compound to form a halide film on the trench sidewall surfaces. Then, the remaining film and the substrate are exposed to the vapor of a monomer under such conditions as to condense the monomer to form a conformal polymer coating on the substrate and on the bottom surface of the trench, the halide film inhibiting substantial deposition of the coating. As a result of this selective deposition, various process steps, such as doping or isotropic etching, can be performed on the exposed trench sidewalls.

The foregoing and other objects, features and advantages of the invention will be apparent from the following more particular description of the preferred embodiments of the invention.

BRIEF DESCRIPTION OF THE DRAWINGS

FIGS. 1a–1b are cross-sectional views of structures resulting at various stages of one embodiment of the process of the present invention;

FIG. 2 is a graph depicting layer thickness of poly-p-xylylene coating formation as a function of deposition time, according to the process of Examples 1–5;

DETAILED DESCRIPTION

Figure 6B:
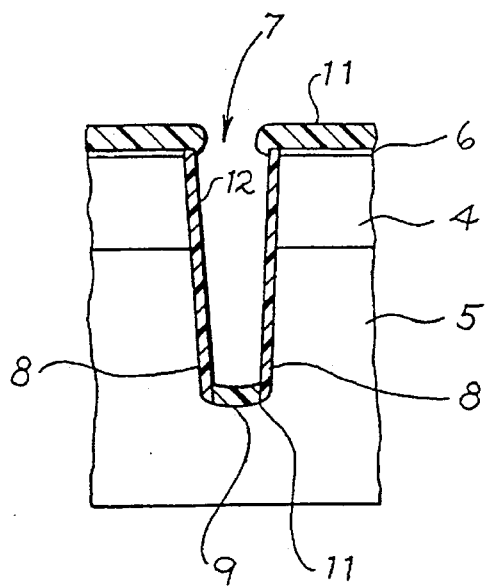
FIGS. 6a and 6b are cross-sectional views of trench structures resulting at various stages according to the process of Example 8.

Referring to FIG. 1a, the process starts by forming a patterned film 2 on a substrate 1, such as, for example, silicon, polysilicon, silicon dioxide, silicon nitride, conventional photoresists, etc. Preferably, the film 2 is formed by exposing the substrate 1 through a mask (not shown) to a gaseous plasma which contains a compound that is strongly electron donating. Generally, the compound is a halogen-containing compound, preferably a fluorine-containing compound, and more preferably a fluorocarbon, such as trifluoromethane ($CHF_3$). Other fluorocarbons, for example, $CF_4$, $CF_2Cl_2$, $C_4F_8$, etc., may be suitably employed. In addition, the plasma may include other compounds, such as oxygen or carbon dioxide, if it is desired, for example, to limit the thickness of the resulting film 2. In general, the film 2 will form to a thickness ranging from about 10–1000 Å, depending upon a number of factors, such as the composition of the plasma, the process conditions, such as pressure, power, time, etc., as should be apparent to those skilled in the art. Typically, the plasma treatment step is carried out in a conventional bell-jar type reactor system, such as an AME 8100, a commercial RIE system available from Applied Materials.

Alternatively, the patterned film 2 may be formed by first forming a film over the substrate 1, and then patterning it in a conventional fashion. For example, a suitable photolithographic material can be applied to the film and then patterned to expose selected areas of the film, followed by etching to transfer the pattern through the photolithographic material to form a pattern of openings in the film, such as shown in FIG. 1a. There again, the result is to expose selected areas of the substrate 1.

Referring to FIG. 1b, the patterned film 2 and the exposed areas of the substrate 1 are then exposed to the vapor of a monomer, which is capable of condensing to form a conformal coating 3. Preferably, the monomer comprises p-xylylene or a derivative thereof, and the vapor is produced by pyrolytic cleavage to produce divalent p-xylylene radicals which condense and polymerize on the exposed areas of the substrate 1 to form a homogeneous coating 3. The pyrolysis is generally carried out at a temperature greater than about 300° C. for a time which is sufficient to form a coating of desired thickness. Preferably, the coating 3 has a thickness ranging from about 50–4000 Å, and is prepared by employing a temperature from about 600°–850° C., at a pressure of about 30–1000 millitorr, for a time from about 0.5–45 minutes. More preferably, the coating 3 has a thickness ranging from about 1000–3000 Å, with the time ranging from about 7–30 minutes.

The resulting poly-p-xylylene polymers can be produced in a conventional apparatus which comprises a deposition chamber, in communication with a vaporization-pyrolysis furnace. The furnace is maintained at a temperature which is sufficiently high to cause evaporation and pyrolysis of the monomer to form the corresponding divalent radicals. These radicals pass to the deposition chamber and condense and polymerize upon contact with the surface of the substrate 1 to form a coating 3 comprising poly-p-xylylene or a derivative thereof. A conventional apparatus is shown, for example, in "Some Mechanical and Electrical Properties of Polyfluoro-p-Xylylene Films Prepared by Chemical Vapor Deposition," J. of Applied Polymer Science, Vol. 40, 1795–1800 (1990), the entire disclosure of which is incorporated herein by reference.

Suitable p-xylylene monomers that can be employed in forming the polymer coatings in accordance with the process of the invention are disclosed, for example, in U.S. Pat. Nos. 3,342,754 and 3,900,600, the entire disclosures of both of which are incorporated herein by reference.

As noted above, the polymer does not substantially form on the patterned film 2. The nature of the film 2 is such that it inhibits substantial deposition of the coating, and this results in a selective deposition, so that the coating forms only on exposed areas of the substrate.

As such, the process of the invention provides a selective deposition of a conformal coating over patterned features of varying geometry. In another preferred embodiment, a conformal polymer coating is deposited on selected surfaces of a substrate trench. Understanding of this embodiment can be facilitated by reference to Examples 6–8 and FIGS. 3a and 3b, 4, 5 and 6a and 6b. The result is that a conformal polymer is deposited on selected surfaces of the trench, such as the bottom, thus allowing further processing steps to be carried out on the exposed substrate trench sidewalls in the fabrication of semiconductor devices.

The following examples are provided to further illustrate the invention.

EXAMPLES 1–5

The purpose of this demonstration was to determine the selectivity of deposition of a coating of poly-p-xylylene on a plasma generated film (Examples 1b–5b) vs. on silicon (Examples 1a–5a).

In Examples 1a–5a, a conventional vapor deposition system was used to deposit a coating of poly-p-xylylene. The substrate (silicon wafer) was placed in the vapor deposition chamber, and about 40–50 grams of p-xylylene were evaporated at 165° C. and 60 millitorr. The vapors were heated in a furnace at 800° C. to pyrolize the p-xylylene and form the corresponding divalent radicals. The radicals were then introduced into the deposition chamber, having a temperature of about 25°–75° C., where they condensed on the substrate surface to form a coating as summarized in Table I below.

In Examples 1b–5b, a film was first generated on a silicon wafer by exposing the wafer to a plasma mixture of trifluoromethane and carbon dioxide. The plasma polymerization was carried out in an AME 8100, a commercial RIE system made by Applied Materials, having a hexagonal-shaped electrode powered by 13.56 Mh rf power. The powered electrode was water cooled and covered with lexan or silicon fillers, the wafer being held to the electrode with four spring held clamps. The film was formed on the silicon surface according to the procedure outlined in Bariya, et al., Proceedings of the Seventh Symposium On Plasma Processing, The Electrochem. Soc., Proceedings Vol. 88-22 (1988), pp. 59–66, the entire disclosure of which is incorporated herein by reference. The following process conditions were employed:

| | |
|---|---|
| Pressure: | 40 millitorr |
| Power: | 1200 watts |
| CHF$_3$ flow: | 75 sccm |
| CO$_2$ flow: | 8 sccm |
| Time: | 4 minutes |

It should be noted that the film, which formed on the silicon surface, can be characterized as a fluorinated polymer represented by the formula: $(CF_x)_y$, where x is 1 to 3 and y is 1 to n, where n is an integer. The addition of the small amount of carbon dioxide caused a slight etching of the polymer, thus reducing the film thickness on the surface. Surface ESCA analysis showed the presence of a thin polymer film (3–5 nm), with CF, CF$_2$ and CF$_3$ bonding with minimal oxygen content. The film can be further characterized as stable and highly electron donating due to the presence of fluorine, which is strongly electronegative.

It is also believed that the following empirical reactions describe the polymer formation:

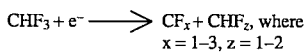
$$CHF_3 + e^- \longrightarrow CF_x + CHF_z, \text{ where } x = 1\text{–}3, z = 1\text{–}2$$

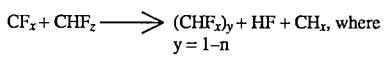
$$CF_x + CHF_z \longrightarrow (CHF_x)_y + HF + CH_x, \text{ where } y = 1\text{–}n$$

It should also be noted that similar fluorine-based (e.g., CF$_4$, CF$_2$Cl$_2$, C$_4$H$_8$, etc.) monomer glow discharges should form polymers of similar composition and similar highly electron donating properties for selective deposition in accordance with the process of the present invention.

Next, a conventional vapor deposition system was used to deposit a coating of poly-p-xylylene on the film-coated silicon wafer, in accordance with the procedure of Examples 1a–5a.

The results show that a coating of poly-p-xylylene was deposited on the surfaces of the silicon wafers in Examples 1a–5a. However, the film, formed on the wafer in Examples 1b–5b, served to inhibit the deposition. As seen in Table I, there was no deposition on the film-coated substrates until a deposition time of 45 minutes was employed; but, even then, the deposition was still greatly less than on the silicon surface under the same conditions. The results are further illustrated in FIG. 2.

TABLE I

| Example No. | Substrate | Deposition time (min.) | Thickness of Coating (Å) |
|---|---|---|---|
| 1a | silicon | 15 | 1855 |
| 1b | film-coated silicon | 15 | 0 |
| 2a | silicon | 30 | 2942 |
| 2b | film-coated silicon | 30 | 0 |
| 3a | silicon | 45 | 3968 |
| 3b | film-coated silicon | 45 | 50 |
| 4a | silicon | 60 | 5169 |
| 4b | film-coated silicon | 60 | 1985 |
| 5a | silicon | 75 | 7624 |
| 5b | film-coated silicon | 75 | 3805 |

The purpose of the demonstration in the following examples was to determine the selectivity of deposition of a coating of poly-p-xylylene on trench substrate surfaces.

EXAMPLE 6

Figure 3A:
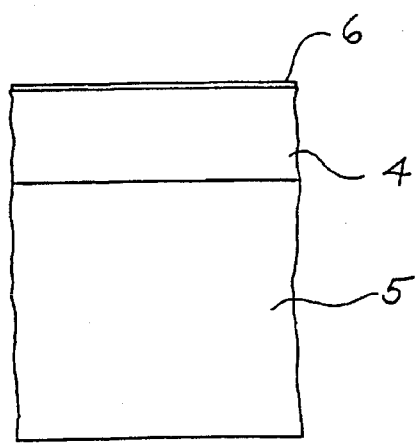
FIGS. 3a–3b are cross-sectional views of trench structures resulting at various stages of another embodiment of the process of the present invention.
Figure 3B:
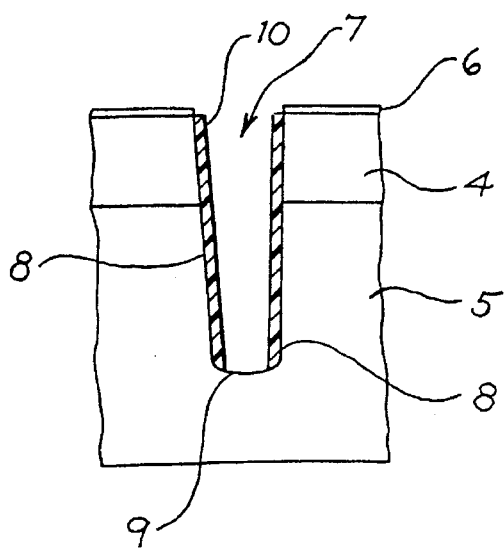

With reference to FIGS. 3a and 3b, trenches were formed in silicon substrates as follows:

A p− epitaxial layer 4 was grown on a p+ substrate 5. A silicon oxide layer 6 was deposited on the epitaxial layer 4 using well known techniques (see FIG. 3a). A photoresist was then applied to the oxide layer 6, and after patterning, selected portions of the oxide layer 6 were removed to expose portions of the epitaxial layer 4. The oxide was etched in an AME 8100 etch tool, using a two-step process, viz. 100 sccm $CF_4$, 20 millitorr pressure and 850 watts of power, followed by 50 sccm $O_2$ at 700 watts of power. The remaining photoresist was then removed to leave an oxide mask 6 for etching the silicon. A trench 7 having sidewall surfaces 8 and a bottom surface 9 was then etched into the epitaxial layer 4 and the p+ substrate 5, again using an AME 8100 etch tool and a two-step chlorine-based chemistry, viz. $BCl_3$ (40 sccm gas flow, 10 millitorr pressure and 950 watts of power), followed by 90 sccm HCl and 30 sccm $Cl_2$ (15 millitorr pressure and 650 watts of power). During the trench etch, a silicon oxychloride film 10 was formed on the sidewall surfaces 8, but not on the bottom surface 9, of the trench 7, as shown in FIG. 3b. It should be noted that this trench etch chemistry is particularly preferred, as it produces substantially vertical sidewall surfaces 8 and a rounded bottom surface 9.

These structures were then used as starting points for carrying out the processes according to Examples 7–9 below.

EXAMPLE 7

Figure 4:
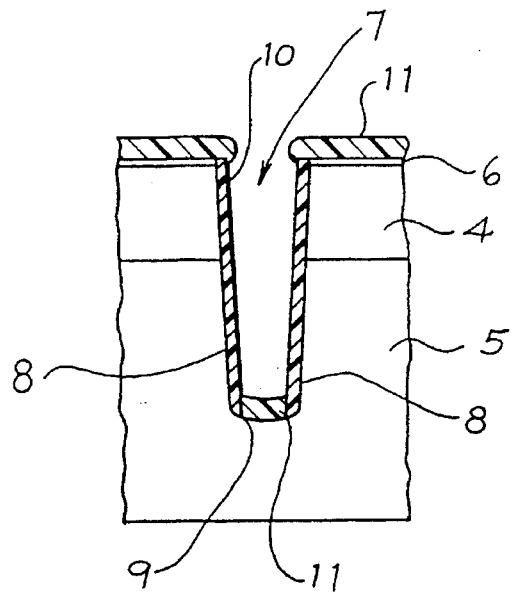
FIG. 4 is a cross-sectional view of a trench structure resulting from selective deposition of a poly-p-xylylene coating according to the process of Example 6.

Referring to FIG. 4, a trench 7 was first formed, following the procedure of Example 6. Then, a coating 11 of poly-p-xylylene (1500 Å) was deposited over the silicon substrate, using the procedure of Examples 1–5. Poly-p-xylylene deposition occurred only on the horizontal substrate surfaces and on the bottom surface 9 of the trench 7. There was no deposition on the sidewalls 8 due to the formation of the silicon oxychloride film 10 during the trench etch, which inhibited deposition of poly-p-xylylene.

EXAMPLE 8

Figure 5:
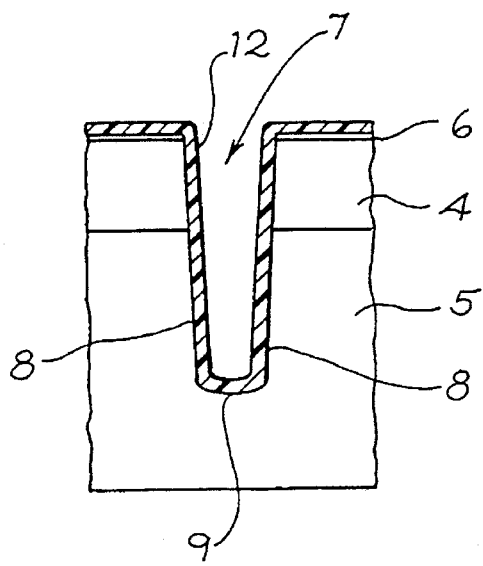
FIG. 5 is a cross-sectional view of a trench structure showing no deposition of poly-p-xylylene according to the process of Example 7.

Referring to FIG. 5, a trench 7 was first formed, following the procedure of Example 6. Then, the oxychloride film 10 was removed from the trench sidewalls 8 by immersing the structure in a solution of buffered hydrofluoric acid. Next, the silicon substrate was exposed to a plasma mixture of trifluoromethane and carbon dioxide, using the procedure of Examples 1–5. This mixture did not etch the silicon surfaces, but did form a film 12 on all surfaces exposed to the plasma. Again following the procedure of Examples 1–5, the film was exposed to the vapor of p-xylylene, but there was no deposition of poly-p-xylylene on any surfaces, due to the presence of the film 12, which inhibited deposition.

EXAMPLE 9

Figure 6A:
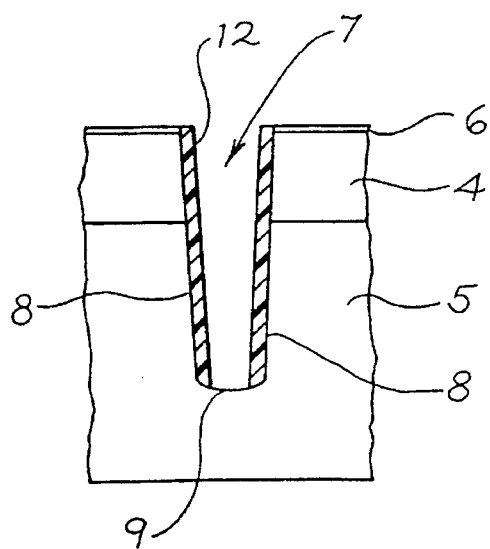

Referring to FIG. 6a, a trench 7 was first formed, following the procedure of Example 6. Then, the oxychloride film 10 was removed from the trench sidewalls 8 by immersing the structure in a solution of buffered hydrofluoric acid. Then, the silicon substrate was exposed to a plasma mixture of trifluoromethane and carbon dioxide, using the procedure of Examples 1–5. This mixture did not etch the silicon surfaces, but did form a film 12 on all surfaces exposed to the plasma. Then, the film 12 was anisotropically etched in an AME 8100 etch tool with oxygen (30 sccm gas flow, 25 millitorr pressure and 500 watts of power), so as to remove the film from the horizontal silicon surfaces, including the bottom surface 9 of the trench 7, but not from the vertical trench sidewalls 8, as shown in FIG. 6a. A coating 11 of poly-p-xylylene (1500 Å) was deposited over the silicon substrate, using the procedure of Examples 1–5. There was no poly-p-xylylene deposition on the vertical trench sidewalls, but only on the horizontal surfaces, including the bottom surface 9 of the trench 7, as illustrated in FIG. 6b. There was no deposition on the sidewalls 8 due to the presence of the film 12, which inhibited deposition of poly-p-xylylene.

What is claimed is:

1. A process for selectively depositing a conformal polymer coating on a substrate, comprising:
    forming a patterned film on said substrate, so as to expose selected areas of said substrate, said film being formed by treating said substrate with a compound having strong electron donor characteristics; and
    exposing said patterned film and said substrate to the vapor of a monomer under such conditions as to condense said monomer to form a conformal polymer coating on said selected areas not covered by said patterned film, said film inhibiting substantial deposition of said coating thereon.

2. The process of claim 1, wherein said film is formed by exposing said substrate to a gaseous plasma comprising a halogen-containing compound.

3. The process of claim 2, wherein said halogen-containing compound contains fluorine.

4. The process of claim 3, wherein said halogen-containing compound is a fluorocarbon.

5. The process of claim 4, wherein said plasma comprises trifluoromethane and carbon dioxide.

6. The process of claim 1, wherein said monomer comprises p-xylylene or a derivative thereof.

7. The process of claim 6, wherein said coating has a thickness ranging from about 50 to about 4000 Å.

8. The process of claim 7, wherein p-xylylene is heated to a temperature of about 600° to about 850° C. at a pressure of about 30 to about 1000 millitorr for a time from about 0.5 to about 45 minutes.

9. The process of claim 8, wherein said coating has a thickness ranging from about 1000 to about 3000 Å, and wherein said p-xylylene is heated for a time ranging from about 7 to about 30 minutes.

10. A process for selectively depositing a conformal polymer coating on a substrate, comprising:

exposing said substrate through a mask to a gaseous plasma comprising a halogen-containing compound to form a film thereon, said film containing a pattern of openings that expose selected areas of said substrate; and exposing said patterned film and said selected areas of said substrate to the vapor of a monomer under such conditions as to condense said monomer to form a conformal polymer coating on said selected areas of said substrate, which does not substantially form on said patterned film.

11. The process of claim 10, wherein said halogen-containing compound is a fluorocarbon and said monomer comprises p-xylylene or a derivative thereof.

12. The process of claim 11, wherein p-xylylene is heated to a temperature of about 600° to about 850° C. at a pressure of about 30 to about 1000 millitorr for a time from about 0.5 to about 45 minutes.

13. A process for selectively depositing a conformal polymer coating on the surfaces of a substrate trench, comprising:

forming a patterned masking material on a substrate, so as to expose selected areas of said substrate;

exposing said selected areas of said substrate to a gaseous plasma comprising a halogen-containing compound to form a trench having sidewall surfaces and a bottom surface, and as to form a halide film on the sidewall surfaces of said trench; and exposing said film and said substrate to the vapor of a monomer under such conditions as to condense said monomer to form a conformal polymer coating on said substrate and on the bottom surface of said trench, said halide film inhibiting substantial deposition of said coating thereon.

14. The process of claim 13, wherein said trench is formed by exposing said substrate to a gaseous plasma comprising a chlorine-containing compound; and wherein said monomer comprises p-xylylene or a derivative thereof.

15. The process of claim 14, wherein said trench is formed by exposing said substrate to a gaseous plasma comprising hydrogen chloride, oxygen and boron trichloride.

16. A process for selectively depositing a conformal polymer coating on the surfaces of a substrate trench, comprising:

forming a patterned masking material on a substrate, so as to expose selected areas of said substrate;

exposing said selected areas of said substrate to a gaseous plasma comprising a halogen-containing compound to form a trench having substantially vertical sidewall surfaces and a bottom surface, and as to form a halide film on the sidewall surfaces of said trench;

removing said halide film;

exposing said substrate to a gaseous plasma comprising a halogen-containing compound to form a film on the sidewall surfaces and the bottom surface of said trench;

ansiotropically etching said film, so as to remove said film from the bottom surface of said trench, while allowing said film to remain on said sidewall surfaces of said trench; and exposing said remaining film and said substrate to the vapor of a monomer under such conditions as to condense said monomer to form a conformal polymer coating on the bottom surface of said trench, where said film has been removed.

17. The process of claim 16, wherein said halide film is removed with a solution of buffered hydrofluoric acid.

* * * * *